(12) United States Patent
Tang

(10) Patent No.: US 11,469,280 B2
(45) Date of Patent: Oct. 11, 2022

(54) ORGANIC LIGHT-EMITTING DIODE DISPLAY

(71) Applicant: WUHAN CHINA STAR OPTOELECTRONICS SEMICONDUCTOR DISPLAY TECHNOLOGY CO., LTD., Hubei (CN)

(72) Inventor: Fan Tang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 392 days.

(21) Appl. No.: 16/615,216

(22) PCT Filed: Feb. 18, 2019

(86) PCT No.: PCT/CN2019/075314
§ 371 (c)(1),
(2) Date: Nov. 20, 2019

(87) PCT Pub. No.: WO2020/037961
PCT Pub. Date: Feb. 27, 2020

(65) Prior Publication Data
US 2021/0367009 A1 Nov. 25, 2021

(30) Foreign Application Priority Data
Aug. 21, 2018 (CN) .......................... 201810951408.5

(51) Int. Cl.
H01L 27/32 (2006.01)
H01L 51/00 (2006.01)

(52) U.S. Cl.
CPC ...... *H01L 27/3246* (2013.01); *H01L 51/0005* (2013.01)

(58) Field of Classification Search
CPC ........................ H01L 27/3246; H01L 51/0005
See application file for complete search history.

(56) References Cited

U.S. PATENT DOCUMENTS

2004/0201048 A1* 10/2004 Seki ....................... H05B 33/10
438/70
2006/0170338 A1* 8/2006 Masuichi ............ H01L 27/3283
313/504

(Continued)

FOREIGN PATENT DOCUMENTS

CN 104882468 A 9/2015
CN 107579099 A 1/2018

(Continued)

*Primary Examiner* — Michael M Trinh
(74) *Attorney, Agent, or Firm* — Hauptman Ham, LLP

(57) ABSTRACT

The present application provides an organic light-emitting diode display. The display includes a plurality of pixel defining units, the pixel defining unit includes a first portion formed on a switch array layer which is not covered by anode electrodes and a second portion formed on the anode electrode, a groove is defined at the first portion, and at least one opening is defined at the second portion; an organic light-emitting layer including a plurality of organic light-emitting units, the organic light-emitting layer is formed on the anode electrodes which are not covered by the second portion.

11 Claims, 2 Drawing Sheets

(56) References Cited

U.S. PATENT DOCUMENTS

| | | | |
|---|---|---|---|
| 2007/0075618 A1* | 4/2007 | Mitsuya | H01L 27/3246 313/504 |
| 2012/0040478 A1* | 2/2012 | Takeuchi | H01L 27/3246 438/23 |
| 2013/0099221 A1* | 4/2013 | Kawamura | H01L 51/52 438/34 |
| 2016/0043150 A1* | 2/2016 | Wang | H01L 27/127 257/40 |
| 2018/0159038 A1 | 6/2018 | Leng | |
| 2020/0044169 A1* | 2/2020 | Zhao | H01L 51/0096 |
| 2020/0161391 A1* | 5/2020 | Zhang | H01L 51/56 |
| 2020/0243621 A1* | 7/2020 | Zhao | H01L 27/3283 |

FOREIGN PATENT DOCUMENTS

| | | |
|---|---|---|
| CN | 107623082 A | 1/2018 |
| CN | 107623083 A | 1/2018 |
| CN | 107706217 A | 2/2018 |
| CN | 109148533 A | 1/2019 |

* cited by examiner

ORGANIC LIGHT-EMITTING DIODE DISPLAY

BACKGROUND OF INVENTION

Field of Invention

The present application relates to a display technical field, and particularly to an organic light-emitting diode display.

Description of Prior Art

As organic light-emitting diodes (OLEDs) have advantages of autonomous light-emitting, a wide operating temperature range, a fast response, a wide vision, high light-emitting efficiency, being able to be produced on a flexible substrate, driving voltage, and low energy consumption, they are hailed to be as the next generation display technology.

However, because of technical difficulty factors and high cost of the existing OLEDs, it is difficult to realize mass production like liquid crystal displays (LCDs), and this results a huge gap in the market. At present, organic light-emitting diode (OLED) panels are mainly manufactured by evaporation processes, but applying the evaporation processes will reduce an utilization rate of material, and for large-sized panels, especially for OLED panels applying a Fine Metal Mask (FMM) technique that it is difficult to ensure uniformity of film thickness due to bending of the substrate.

Afterwards, the OLED panels are manufactured by inkjet printing technology. The inkjet printing technology is dissolving an OLED material in a solvent or dispersing the OLED material as nanometer droplets in a solvent, and then spraying the material onto a substrate surface through a nozzle and forming a film through a drying process. The inkjet printing technology has a high material utilization rate, a simple production process, and is easy to produce large panels. However, the inkjet printing technology needs to strictly control sizes of the droplets sprayed from the printing nozzle during the manufacturing process, and to ensure its uniformity, secondly, a volume of each light-emitting layer of inkjet printing ink must be consistent to ensure the uniformity of film thickness. In addition, during the printing process, it is necessary to ensure that the light-emitting layer inkjet printing ink is accurately sprayed on a corresponding light-emitting region, and cannot be sprayed on other light-emitting regions, otherwise to cause color mixing. It can be seen that the existing inkjet printing technology is prone to uneven film thickness and color mixing.

Therefore, it is necessary to provide an organic light-emitting diode display to solve the existing technological problems.

SUMMARY OF INVENTION

An object of the present application is to provide an organic light-emitting diode (OLED) display, so as to improve a uniformity of film thickness and reduce the color mixing.

For the above-mentioned objective, the present application provides an organic light-emitting diode (OLED) display, including:
a substrate base;
a switch array layer formed on the substrate base;
a first conductive layer formed on the switch array layer, wherein the first conductive layer comprises a plurality of anode electrodes spaced from each other;
a plurality of pixel defining units, wherein the pixel defining unit comprises a first portion and a second portion, the first portion is formed on the switch array layer which is not covered by the anode electrodes, the second portion is formed on the anode electrode and located at periphery of the anode electrode; wherein a groove is defined at the first portion, at least one opening is defined at the second portion; a width of the opening is less than a width of the second portion; material of the pixel defining unit comprises at least one of organic photoresist, silicon nitride, silicon oxide, and silicon dioxide; and
an organic light-emitting layer comprising a plurality of organic light-emitting units, wherein the organic light-emitting layer is formed on the anode electrodes which are not covered by the second portions.

The OLED display of the present application, the second portion includes a first sub layer and a second sub layer, the second sub layer is formed on the first sub layer, and the opening is defined at the second sub layer.

The OLED display of the present application, a height of the opening is the same as a thickness of the second sub layer.

The OLED display of the present application, the opening is connected to light-emitting region and the groove, the light-emitting region is a region that formed in the second portion and corresponding to the anode electrode.

The OLED display of the present application, a polarity of the material of the second sub layer is opposite to that of the light-emitting layer inkjet printing ink, a contact angle between the light-emitting layer inkjet printing ink and the second sub layer is greater than 45 degreess; a polarity of the material of the first sub layer is the same as that of the light-emitting layer inkjet printing ink, a contact angle between the light-emitting layer inkjet printing ink and the first sub layer ranges from 10 degrees to 45 degrees.

The OLED display of the present application, a top of the anode electrode is higher than a horizontal top of the groove, which the horizontal top is a top of a horizontal portion of the groove, and the groove includes horizontal portion and vertical portion.

The OLED display of the present application, a height of the opening is less than that of the second portion.

The OLED display of the present application, the pixel defining layer is a single layer structure, a polarity of the material of the first portion is the same as that of the light-emitting layer inkjet printing ink, a contact angle between the light-emitting layer inkjet printing ink and the first portion ranges from 10 degrees to 45 degrees; a polarity of the material of a top surface of the second portion is opposite to that of the light-emitting layer inkjet printing ink, a contact angle between the light-emitting layer inkjet printing ink and the top surface of the second portion is greater than 45 degrees.

The OLED display of the present application, a thickness of the second portion is set according to a volume of the light-emitting layer inkjet printing ink.

The present application provides an organic light-emitting diode (OLED) display, including:
a substrate base;
a switch array layer formed on the substrate base;
a first conductive layer formed on the switch array layer, wherein the first conductive layer comprises a plurality of anode electrodes spaced from each other;

a plurality of pixel defining units, wherein the pixel defining unit comprises a first portion and a second portion, the first portion is formed on the switch array layer which is not covered by the anode electrodes, the second portion is formed on the anode electrode and located at periphery of the anode electrode; wherein a groove is defined at the first portion, at least one opening is defined at the second portion; and an organic light-emitting layer comprising a plurality of organic light-emitting units, wherein the organic light-emitting layer is formed on the anode electrodes which are not covered by the second portions.

The OLED display of the present application, the second portion includes a first sub layer and a second sub layer, the second sub layer is formed on the first sub layer, and the opening is formed on the second sub layer.

The OLED display of the present application, a height of the opening is the same as a thickness of the second sub layer.

The OLED display of the present application, the opening is connected to light-emitting region and the groove, the light-emitting region is a region that formed in the second portion and corresponds to the anode electrode.

The OLED display of the present application, a polarity of the material of the second sub layer is opposite to that of the light-emitting layer inkjet printing ink, a contact angle between the light-emitting layer inkjet printing ink and the second sub layer is greater than 45 degrees; a polarity of the material of the first sub layer is the same as that of the light-emitting layer inkjet printing ink, a contact angle between the light-emitting layer inkjet printing ink and the first sub layer ranges from 10 degrees to 45 degrees.

The OLED display of the present application, a top of the anode electrode is higher than a horizontal top of the groove, which the horizontal top is a top of a horizontal portion of the groove, and the groove includes horizontal portion and vertical portion.

The OLED display of the present application, a height of the opening is less than that of the second portion.

The OLED display of the present application, a width of the opening is less than that of the second portion.

The OLED display of the present application, the pixel defining unit is a single layer structure, wherein a polarity of the material of the first portion is the same as that of the light-emitting layer inkjet printing ink, a contact angle between the light-emitting layer inkjet printing ink and the first portion ranges from 10 degrees to 45 degrees; a polarity of the material of a top surface of the second portion is opposite to that of the light-emitting layer inkjet printing ink, a contact angle between the light-emitting layer inkjet printing ink and the top surface of the second portion is greater than 45 degrees.

The OLED display of the present application, wherein a thickness of the second portion is set according to a volume of the light-emitting layer inkjet printing ink.

The OLED display of the present application, wherein a thickness of the pixel defining unit ranges from 0.5 um-10 um.

An OLED display of the present application provides openings and grooves on the pixel defining units, therefore, when the nozzle is deflected, the ink printed by mistake will be sprayed into the grooves, so as to prevent the light-emitting layer inkjet printing ink from spraying into other light-emitting regions during the printing process, and to avoid color mixing; in addition, when volume of the ink is larger, an excess of light-emitting layer inkjet printing ink will flow from the openings to the grooves, thus improving a uniformity of the film thickness.

BRIEF DESCRIPTION OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
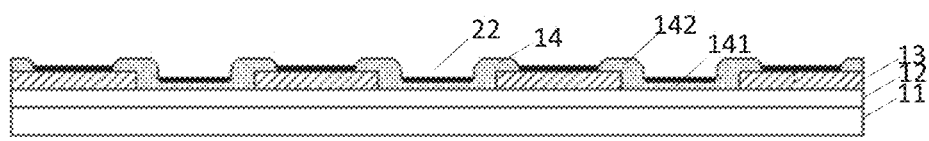
FIG. 1 is a schematic view of an OLED display of the present application.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

Referring to FIG. 1 to FIG. 6, FIG. 1 is a schematic view of an organic light-emitting diode (OLED) display of the present application.

The OLED display of the present application includes a substrate base 11, a switch array layer 12, a first conductive layer, a plurality of pixel defining units 14, and an organic light-emitting layer 15.

The switch array layer 12 is formed on the substrate base 11, the switch array layer 12 can include a plurality of switch components, for example, the switch component is a thin film transistor.

The first conductive layer is formed on the switch array layer 12, the first conductive layer includes a plurality of anode electrodes 13 spaced from each other.

Figure 2:
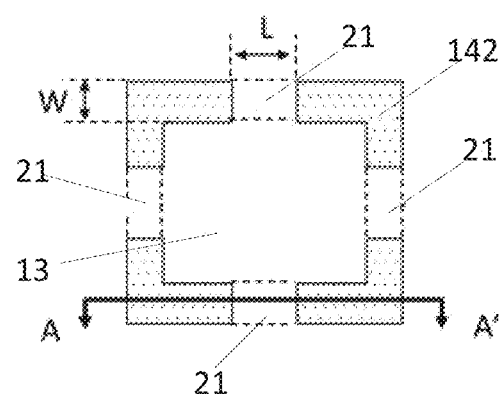
FIG. 2 is a top view of a second portion of a pixel defining unit of the present application.

The pixel defining unit 14 is located between two adjacent anode electrodes, the pixel defining unit 14 includes a first portion 141 and a second portion 142, the first portion 141 is formed on the switch array layer 12 which is not covered by the anode electrode, that is, the first portion includes a portion that is horizontally located on the switch array layer 12 and a portion that is vertically located on the switch array layer 12, a shape of the first portion is a U shape. Referring to FIG. 2, the second portion 142 is formed on the anode electrode 13 and is located around a periphery of the anode electrode 13, that the second portion 142 is located around the periphery of the anode electrode 13. The second portion 142 is limited to the anode electrode 13 to define a light-emitting region, that the light-emitting region is a region that is located in the second portion 142 and corresponds to the anode electrode, or the light-emitting region is located on the second portion 142 which is not covered by the anode electrode 13, and a height of the light-emitting region is less than a height of the second portion 142 (that is, a region located at an inner rectangle in FIG. 2).

The first portion 141 defines a groove 22, and the groove 22 includes a horizontal portion and a vertical portion. A top of the anode electrode 13 is greater than a horizontal top of the groove 22, the horizontal top is a top of a horizontal portion of the groove 22, that is, the groove 22 includes two side walls and a bottom, and the horizontal top is a top surface of the groove 22.

The second portion 142 defines openings 21; a height H2 of the opening is less than a height of the second portion 142, a height of the second portion 142 is H2 plus H1.

The opening 21 is configured to connect between the light-emitting region and the groove 22, the light-emitting region is a region that is formed in the second portion 142 and corresponds to the anode electrode. Although there are four openings 21 that are formed in the second portion 142 of the FIG. 2, the present application is not limited to provide one or more openings. The opening 21 can be formed at an arbitrary position of the second portion 142. A width of the opening 21 is less than a width of the second portion 142, in one embodiment, a cross-section shape of the second portion 142 is a quadrangle, an opening 21 is formed on at least one side of the second portion 142, a width of an opening 21 located on one side of the second portion 142 is less than a width of the corresponding side of the second portion 142. For example, a width L of an opening 21 located on one side of the second portion 142 is less than a width W of one side of the second portion 142. Of course, it is understandable that the cross-section shape of the second portion 142 can also be a round or other shapes.

A length L of an opening 21 located on one side of the second portion 142 is equal to or less than a length of the corresponding side of the second portion 142. A width of an opening 21 located on one side of the second portion 142 is less than a length of a side of the second portion 142.

In one embodiment, a height of an inner side of the opening 21 is less than a height of an outer side of the opening 21. The outer side of the opening 21 is close to the groove 22, and the inner side of an opening 21 is far away from the groove 22.

Material of the pixel defining unit 14 can be made of an organic material or a inorganic material, and includes at least one of organic photoresist, silicon nitride, silicon oxide, and silicon dioxide.

In order to make more uniform of a film thickness of the organic light-emitting layer, a thickness of the second portion 142 is set according to a volume of the light-emitting layer inkjet printing ink. A thickness of the second portion 142 is correlated to a volume of the light-emitting layer inkjet printing ink, a top of the light-emitting layer inkjet printing ink in the light-emitting region is higher than a thickness of the second portion 142, but not more than 50% of the thickness of the second portion 142. The ink that in excess of the second portion 142 flows into the groove 22 through the opening 21.

Further, a thickness of the pixel defining unit ranges from 0.5 um-10 um.

Figure 3:
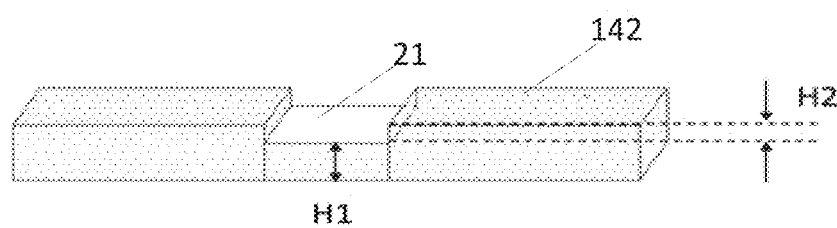
FIG. 3 is a cross-sectional view of the pixel defining unit of FIG. 2 taken along a direction of AA' of a first exemplary embodiment of the present application.

In one embodiment, referring to FIG. 3, the pixel defining unit 14 is a single layer structure. Both of the first portion 141 and the second portion 142 are single layer structures.

Figure 4:
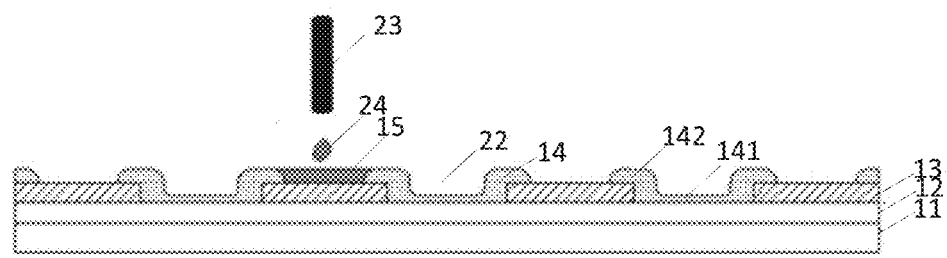
FIG. 4 is a schematic view of printing an organic light-emitting layer on the OLED display of the present application.

Referring to FIG. 4, a polarity of the material of the first portion 141 is the same as a polarity of the light-emitting layer inkjet printing ink, a contact angle between the light-emitting layer inkjet printing ink and the first portion ranges from 10 degrees to 45 degrees; a polarity of the material of a top surface of the second portion 142 is opposite to a polarity of the light-emitting layer inkjet printing ink, a contact angle between the light-emitting layer inkjet printing ink and the top surface of the second portion is greater than 45 degrees. It is understandable that a contact angle between the side wall of the second portion 142 and the light-emitting layer inkjet printing ink ranges from 10 degrees to 45 degrees.

The organic light-emitting layer 15 is formed on the anode electrode 13 which is not covered by the second portion 142, and the organic light-emitting layer 15 is formed by spraying printing the light-emitting layer inkjet printing ink 24 on the anode electrode 13 which is not covered by the second portion 142. Specifically, the light-emitting layer inkjet printing ink 24 is sprayed by a nozzle 23, and the light-emitting layer inkjet printing ink 24 is made by dissolving the OLED material in a solvent or dispersing the OLED material in a solvent as nanometer droplets.

In the detail process, after finishing a process of forming the anode electrode 13, the pixel defining unit material is coated on the surface of the anode electrode, and the pixel defining unit 14 is cured and formed, a polarity of the material of the pixel defining unit 14 is the same as a polarity of the light-emitting layer inkjet printing ink 24, a contact angle between the light-emitting layer inkjet printing ink 24 and the pixel defining unit ranges from 10 to 45 degrees, so as to improve the uniformity of the film thickness in the organic light-emitting layer. That is, a polarity of the material of the first portion is the same as a polarity of the light-emitting layer inkjet printing ink, a contact angle between the light-emitting layer inkjet printing ink and the first portion 141 ranges from 10 degrees to 45 degrees;

And then, an upper surface of the second portion 142 is treated to obtain a surface with an opposite polarity of the material of the light-emitting layer inkjet printing ink 24, and a contact angle between the light-emitting layer inkjet printing ink 24 and the upper surface of the second portion 142 is greater than 45 degrees. That is, a polarity of the material of the upper surface of the second portion 142 is opposite to a polarity of the light-emitting layer inkjet printing ink, and the contact angle between the light-emitting layer inkjet printing ink and the upper surface of the second portion is greater than 45 degrees.

The anode electrode 13 which is not covered by the second portion 142 is exposed and developed to form the light-emitting region. A region that needs to form the groove in the pixel defining unit 14 located on the switch array layer 12 is exposed and developed to obtain the groove 22. A region that needs to form the openings 21 on the second portion 142 is exposed and developed to obtain the openings 21.

Referring to FIG. 4, when the nozzle 23 prints the light-emitting layer inkjet printing ink 24 on the light-emitting region of the above base, if a height of the light-emitting layer inkjet printing ink 24 located on the light-emitting region is higher than a height of the opening 21 of the second portion 142, an excess of the light-emitting layer inkjet printing ink 24 flows into the groove 22. Then the light-emitting layer inkjet printing ink 24 is baked to form a film, and further the organic light-emitting layer 15 is formed by a film layer printing process or vacuum coating process.

Figure 5:
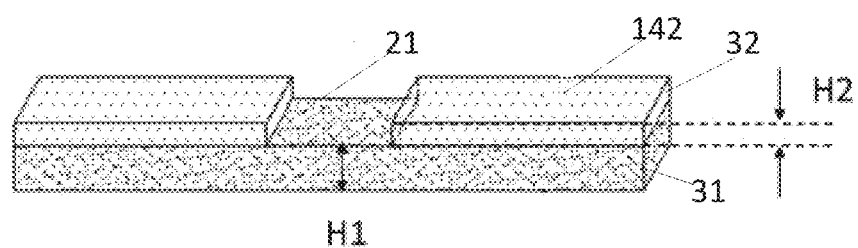
FIG. 5 is a second cross-sectional view of the pixel defining unit of FIG. 2 taken along the direction of AA' of the first exemplary embodiment of the present application.

In another embodiment, referring to FIG. 5, a portion of the pixel defining unit 14 is a double layer structure, and that is, the second portion 142 is a double layer structure. The second portion 142 includes a first sub layer 31 and a second sub layer 32, the second sub layer 32 is formed on the first sub layer 31, and the openings 21 are formed on the second sub layer 32.

Preferably, in order to simplify the production process and reduce the production cost, a height of the opening 21 is the same as a thickness of the second sub layer 32.

In one embodiment, in order to improve the film thickness uniformity of the organic light-emitting layer, a height of the inner side of the opening 21 is less than a height of the outer side of the opening 21. The outer side of the opening 21 is close to the groove 22, and the inner side of the opening 21 is far away from the groove 22.

In the specific process, after finishing the process of forming the anode electrode 13, a material of the first sub layer 31 is coated on a surface of the base containing the anode electrode, and cured to form the first sub layer 31, the polarity of the material of the first sub layer 31 is the same as the polarity of the inkjet printing ink 24 of the light-emitting layer, a contact angle between the inkjet printing ink 24 of the light-emitting layer and the first sub layer 31 ranges from 10 to 45 degrees.

The anode electrode 13 which is not covered by the second portion 142 is exposed and developed to form the light-emitting region. The region that needs to form a groove in the first sub layer 31 located on the switch array layer 12 is exposed and developed to obtain the groove 22.

A material of the second sub layer 32 is coated on the surface of the base, and cured, exposed, and developed to form the second sub layer 32, and then a region that needs to form the opening on the second sub layer 32 is exposed and developed to obtain the opening 22. Depending on the photoresist used, the time of exposing and developing is different. The polarity of the material of the second sub layer 32 is opposite to the polarity of the inkjet printing ink 24 of the light-emitting layer, a contact angle between the light-emitting layer inkjet printing ink 24 and the second sub layer 32 is greater than 45 degrees.

During the process of printing, there may be a difference in the volume of ink ejected from the nozzle, and the ink volume in each light-emitting region between the whole panel and the substrate is different to make uneven film thicknesses and affect the light-emitting uniformity, so the present application accurately calculates the height of the opening 21 according to concentration of the ink, and during the printing process, the planned volume of the ink is more than the actual required volume of the ink, the excess of ink flows into the groove 22 through the openings 21, so finally the amount of each light-emitting region is correlated to the height of the openings, that is, the heights of the openings of each pixel defining unit are same to make the thicknesses of the light-emitting layer to be the same.

As the first portion 141 provides a groove 22, so the excess of ink in the light-emitting region flows into the groove 22, when the amount of ink in the each light-emitting region is more, the excess of the ink flows into the groove 22 through the opening 21 on the second portion by controlling the height of the groove 22, that is the remain amount of ink in each light-emitting is correlated to the height of opening on the second portion, so the height of the opening is controlled to ensure the uniformity of the organic light-emitting film thickness.

Figure 6:
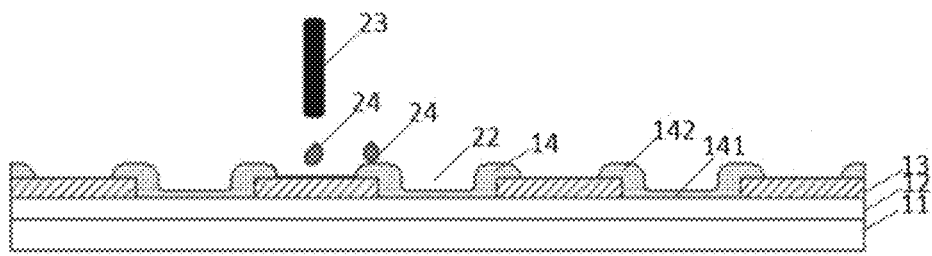
FIG. 6 is a schematic view of a printing ink drop deflection of the OLED display of the present application.

Referring to FIG. 6, when the nozzle 23 prints the light-emitting layer inkjet printing ink 24 on the light-emitting region of the above base, if a height of the light-emitting layer inkjet printing ink 24 located on the light-emitting region is higher than a height of the opening 21 of the second portion 142, an excess of the light-emitting layer inkjet printing ink 24 flows into the groove 22 through the openings 21. Then the light-emitting layer inkjet printing ink 24 is baked to form a film, and further the organic light-emitting layer 15 is formed by a film layer printing process or vacuum coating process.

Referring to FIG. 6, when the location of the nozzle 23 is deflecting during the OLED printing process, on the one hand, the light-emitting layer inkjet printing ink 24 (hereinafter referred to as ink) with error printing will be printed into the groove 22 to avoid color mixing; on the other hand, the ink 24 printed on the second portion 142 flows into the groove, and does not flow to the light-emitting region of other corresponding colors, so as to avoid color mixing. And more, the excess amount of the ink flows into the groove through the opening on the second portion when too much ink is printed on the light-emitting region, and so as to avoid the uneven film thickness of the organic light-emitting layer caused by volume of the ink droplets is different.

An OLED display of the present application provides openings and grooves on the pixel defining units, therefore, when the nozzle is deflected, the ink printed by mistake will be sprayed into the grooves, so as to prevent the light-emitting layer inkjet printing ink from spraying into other light-emitting regions during the printing process, and to avoid color mixing; in addition, when volume of the ink is larger, an excess of light-emitting layer inkjet printing ink will flow from the openings to the grooves, thus improving a uniformity of the film thickness.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. An organic light-emitting diode display, comprising:
a substrate base;
a switch array layer formed on the substrate base;
a first conductive layer formed on the switch array layer, wherein the first conductive layer comprises a plurality of anode electrodes spaced from each other;
a plurality of pixel defining units, wherein the pixel defining unit comprises a first portion and a second portion, the first portion is formed on the switch array layer which is not covered by the anode electrode, the second portion is formed on the anode electrode and located at periphery of the anode electrode; wherein a groove is defined at the first portion, at least one opening is defined at the second portion; a width of the opening is less than a width of the second portion; material of the pixel defining unit comprises at least one of organic photoresist, silicon nitride, silicon oxide, and silicon dioxide; and
an organic light-emitting layer comprising a plurality of organic light-emitting units, wherein the organic light-emitting layer is formed on the anode electrodes which are not covered by the second portions,
wherein:

the pixel defining unit is a single layer structure,
a polarity of a material of the first portion is the same as a polarity of a material of a light-emitting layer inkjet printing ink,
a contact angle defined between the light-emitting layer inkjet printing ink and the first portion ranges from 10 degrees to 45 degrees,
a polarity of a material of a top surface of the second portion is opposite to a polarity of a material of the light-emitting layer inkjet printing ink, and
a contact angle defined between the light-emitting layer inkjet printing ink and the top surface of the second portion is greater than 45 degrees.

2. The organic light-emitting diode display of claim 1, wherein the opening is configured to connect between a light-emitting region and the groove, the light-emitting region is disposed in a region of the second portion and corresponds to the anode electrode.

3. The organic light-emitting diode display of claim 1, wherein a top of the anode electrode is higher than a horizontal top of the groove, the horizontal top is a top of a horizontal portion of the groove, and the groove comprises a horizontal portion and a vertical portion.

4. The organic light-emitting diode display of claim 1, wherein a height of the opening is less than a height of the second portion.

5. The organic light-emitting diode display of claim 1, wherein a thickness of the second portion is defined by a volume of the light-emitting layer inkjet printing ink, wherein a top of the light-emitting layer inkjet printing ink in the light-emitting region is higher than a thickness of the second portion, but not more than 50% of the thickness of the second portion.

6. An organic light-emitting diode display, comprising:
a substrate base;
a switch array layer formed on the substrate base;
a first conductive layer formed on the switch array layer, wherein the first conductive layer comprises a plurality of anode electrodes spaced from each other;
a plurality of pixel defining units, wherein the pixel defining unit comprises a first portion and a second portion, the first portion is formed on the switch array layer which is not covered by the anode electrodes, the second portion is formed on the anode electrode and located at periphery of the anode electrode; wherein a groove is defined at the first portion, at least one opening is defined at the second portion; and
an organic light-emitting layer comprising a plurality of organic light-emitting units, wherein the organic light-emitting layer is formed on the anode electrodes which are not covered by the second portions,
wherein:
the pixel defining unit is a single layer structure,
a polarity of a material of the first portion is the same as a polarity of a material of a light-emitting layer inkjet printing ink,
a contact angle defined between the light-emitting layer inkjet printing ink and the first portion ranges from 10 degrees to 45 degrees,
a polarity of a material of a top surface of the second portion is opposite to a polarity of a material of the light-emitting layer inkjet printing ink, and
a contact angle defined between the light-emitting layer inkjet printing ink and the top surface of the second portion is greater than 45 degrees.

7. The organic light-emitting diode display of claim 6, wherein the opening is configured to connecting between a light-emitting region and the groove, the light-emitting region is disposed in a region of the second portion and corresponds to the anode electrode.

8. The organic light-emitting diode display of claim 6, wherein a top of the anode electrode is higher than a horizontal top of the groove, the horizontal top is a top of a horizontal portion of the groove, and the groove comprises a horizontal portion and a vertical portion.

9. The organic light-emitting diode display of claim 6, wherein a height of the opening is less than a height of the second portion.

10. The OLED display of claim 6, wherein a thickness of the second portion is defined by a volume of the light-emitting layer inkjet printing ink, wherein a top of the light-emitting layer inkjet printing ink in the light-emitting region is higher than a thickness of the second portion, but not more than 50% of the thickness of the second portion.

11. The OLED display of claim 6, wherein a thickness of the pixel defining unit ranges from 0.5 um-10 um.

\* \* \* \* \*